United States Patent
Weekamp

(10) Patent No.: US 7,160,476 B2
(45) Date of Patent: Jan. 9, 2007

(54) METHOD OF MANUFACTURING AN ELECTRONIC DEVICE

(75) Inventor: Johannus Wilhelmus Weekamp, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 44 days.

(21) Appl. No.: 10/510,590

(22) PCT Filed: Apr. 10, 2003

(86) PCT No.: PCT/IB03/01300

§ 371 (c)(1),
(2), (4) Date: Oct. 8, 2004

(87) PCT Pub. No.: WO03/084861

PCT Pub. Date: Oct. 16, 2003

(65) Prior Publication Data

US 2005/0121413 A1   Jun. 9, 2005

(30) Foreign Application Priority Data

Apr. 11, 2002  (EP) .................................. 02076427
Aug. 5, 2002  (EP) .................................. 02078208
Oct. 30, 2002  (EP) .................................. 02079545

(51) Int. Cl.
*H01B 13/00*   (2006.01)

(52) U.S. Cl. ............................. 216/13; 216/2; 216/83; 438/125; 438/455; 438/456; 438/457; 438/459; 257/328

(58) Field of Classification Search .................... 216/2, 216/13, 83; 438/125, 455, 456, 457, 459; 257/328
See application file for complete search history.

(56) References Cited

U.S. PATENT DOCUMENTS

| | | | | | |
|---|---|---|---|---|---|
| 5,043,534 | A | * | 8/1991 | Mahulikar et al. | 174/52.4 |
| 5,155,299 | A | * | 10/1992 | Mahulikar et al. | 174/52.4 |
| 5,738,797 | A | * | 4/1998 | Belke et al. | 216/16 |
| 6,146,917 | A | * | 11/2000 | Zhang et al. | 438/51 |

* cited by examiner

*Primary Examiner*—Shamim Ahmed
(74) *Attorney, Agent, or Firm*—Peter Zawilski; Paul Im

(57) ABSTRACT

The electronic device (100) comprises an electrical element (30), for instance a MEMS capacitor or a BAW filter in a cavity (37) that is protected from the environment by a cover (38). The cover (38) is a patterned layer which is mechanically embedded in isolating material (7) present beside the cavity (37) and may further include contact pads (41). The device (100) may be suitably manufactured from an accurately folded foil including a patterned layer and a sacrifice layer. After applying the foil to the cavity (37) the isolating material (7) is provided and the sacrifice layer is removed. The patterned layer, or part thereof, stays behind and forms the cover (38).

21 Claims, 3 Drawing Sheets

Figure 1:
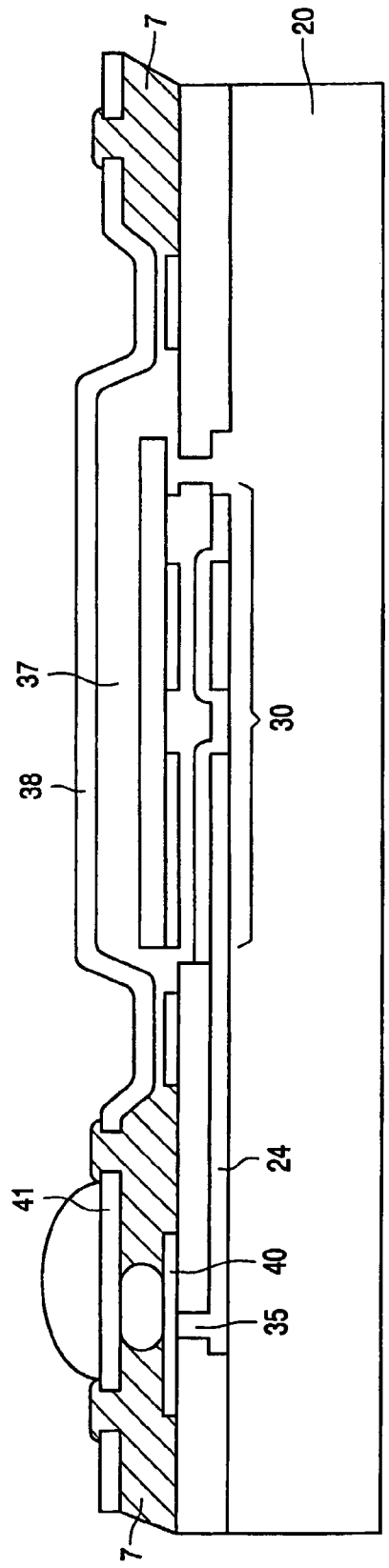

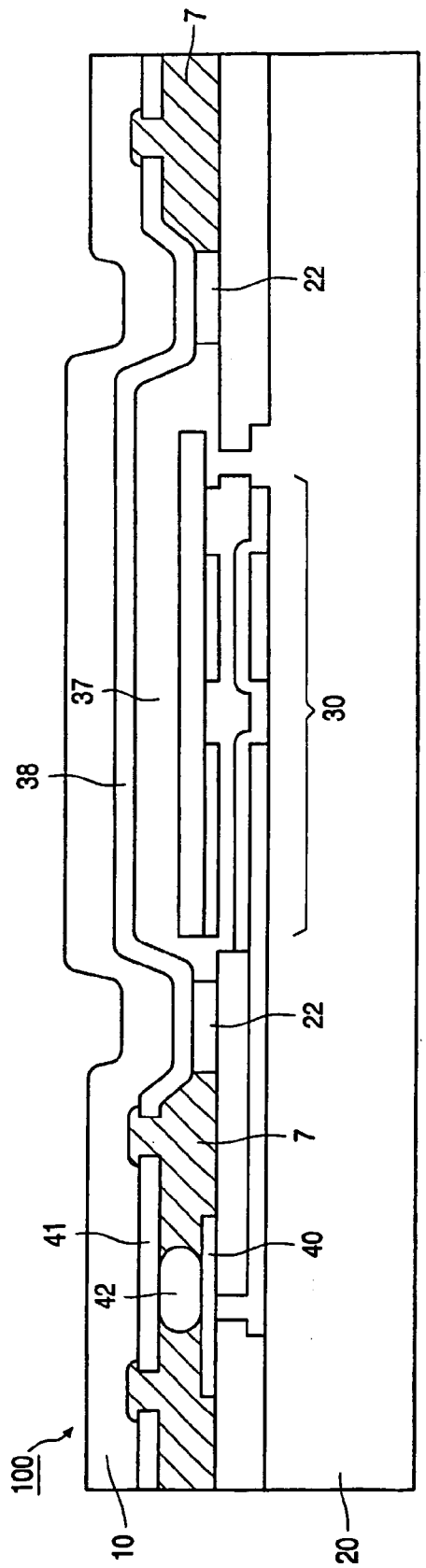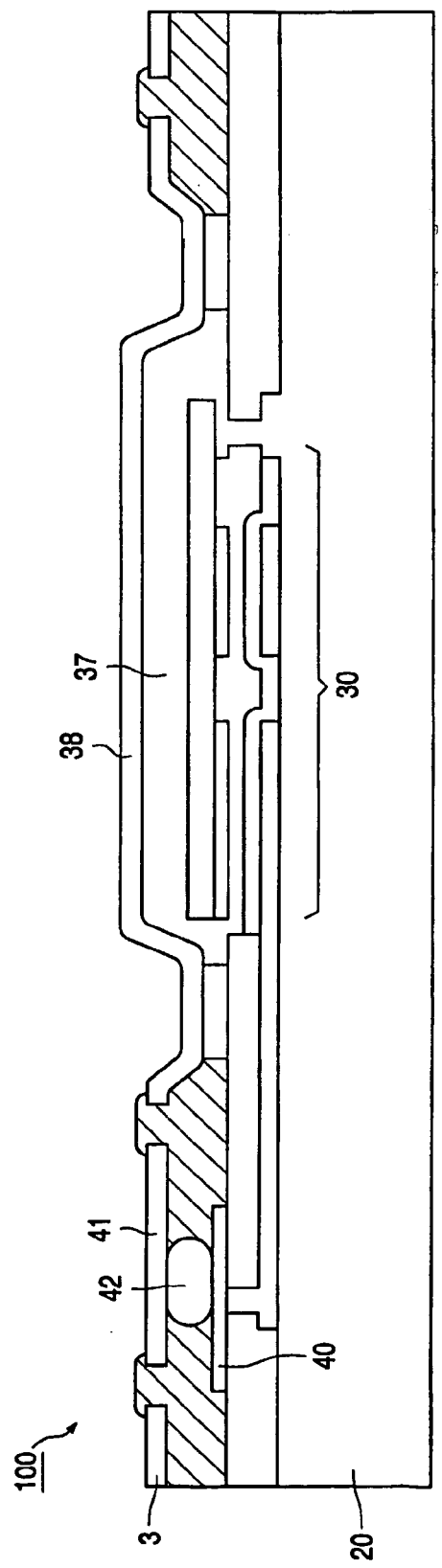
FIG. 2D
FIG. 2E

METHOD OF MANUFACTURING AN ELECTRONIC DEVICE

The invention relates to a method of manufacturing an electronic device comprising a substrate with a metallization side, on which metallization side an electrical element is present in a cavity that is bounded by the substrate and a cover, the method comprising the steps of:
 providing a foil;
 applying the foil to the metallization side of the substrate while forming the cavity, part of the foil forming the cover; and
 affixing the cover to the substrate.

The invention also relates to an electronic device comprising a substrate with a metallization side, on which metallization side an electrical element is present in a cavity that is bounded by the substrate and a cover.

Such a method is known from EP-A 939485. The known device particularly comprises a surface-acoustic wave filter as an electrical element. The cavity is surrounded by the substrate, a polyimide spacer and a polyimide foil as a cover. The spacer has a thickness of about 5 μm and has a hole at the location of the cavity. The polyimide foil has a thickness of about 20 μm. The foil is affixed to the spacer by lamination of the light-sensitive dry films to the spacer. Then via holes are provided in the foil and the spacer by means of photolithography, which via holes are positioned beside the cavity.

It is a disadvantage of the known method that two foils are to be applied to the substrate to form the cavity. It may also be the case that the spacer is not patterned until after its application; the disadvantage of this is, however, that the layer of the spacer will cover the electrical element, which is often undesired.

Consequently, it is first object of the invention to provide a method of the type defined in the opening paragraph in which not more than a single assembly step is necessary for forming the cavity and the electrical element is nevertheless not covered by a layer during manufacture.

This object is achieved in that
 a foil is provided which comprises a patterned layer on the first side and a sacrifice layer on the second side,
 the foil is applied to a protruding part of the substrate, an interstice between the substrate and the foil developing around the cavity; and,
 the foil is affixed to the substrate by filling an interstice around the substrate with isolating material.

In the method according to the invention the foil is affixed to a protruding part of the substrate by filling an interstice around the substrate with isolating material. Thus a package is produced by executing a single assembly step which is followed by the introduction of isolating material.

The protruding part of the substrate is, for example, a metallization. On the other hand, it may be a stack of a metallization and isolating auxiliary layers. It may also be that the cavity is partly situated in the substrate. It may be that for the protruding part an annular metal or solder ball is used. The electrical connection of the electrical element to other parts of the device or to external contacts in the resulting device takes place via the metallization or the substrate. An adhesion-boosting layer can subsequently be added to the patterned layer. This may be a mono layer or a glue layer. This adhesive boosting layer could also be applied to the protruding parts, but this requires a patterned application, which calls forth additional steps.

The electrical element in the device according to the invention may vary. Examples are, inter alia, bulk and surface-acoustic wave filters (BAW, SAW), capacitors, micro-electromechanical system (MEMS) elements, such as switches and tunable capacitors, memory elements with deviating moist-sensitive materials such as the magnetic random access memory (MRAM). The execution with MEMS elements is highly advantageous because during the formation of a cover no layer must be deposited on the element. Obviously, various elements may be present in a cavity.

As a substrate may be used, inter alia, a layer of plastic, ceramics, glass or semiconductor material. It is then not impossible and in many cases even advantageous for the substrate to contain conductors and elements which are included in the same circuit as the electrical element. An example of this is that the substrate comprises a fully integrated circuit having a suitable passivation layer as the top layer.

Very many materials are suitable for isolating material provided it can be applied as a liquid. One may think of polymers such as epoxy-like materials, polyacrylates, polyimides, but also ceramic materials such as silicon, alumina and related materials which are applied by sol-gel processing, and organic materials such as benzocyclobuthene. It is highly advantageous to apply a thermally durable material since the foil is not transparent of necessity. If there are many vertical interconnectors present beside the cavity, it is to be preferred to apply a material having a low dielectrical constant such as an alkyl-substituted silicon HSQ, benzocyclobuthene, SiLk.

In an advantageous embodiment of the method a patterned sub-layer is present in the carrier between the patterned layer and the sacrifice layer, which patterned layer and sub-layer have a first and a second pattern which are mutually distinguished by a recess that has a larger diameter in the plane of the sub-layer than in the plane of the patterned layer thanks to which carrier the patterned layer is embedded in the isolating material when the isolating material is applied. While the isolating material is being applied, not only the interstice around the cavity is filled, but the recess/recesses between the patterns in the patterned layer and in the sub-layer. Since the diameter of the recess in the plane of the sub-layer exceeds that in the plane of the patterned layer, the isolating material protrudes on various sides from the patterned layer i.e. over it, under it and beside it. This causes a mechanical embedding to evolve, which is beneficial to the robustness of the cavity.

In an advantageous embodiment of the method the sacrifice layer is removed after the foil has been affixed. The sacrifice layer which contains, for example, aluminum or otherwise an organic layer or a polymer, may indeed serve as a protective layer. Holes can also be defined in the sacrifice layer in a photolithographic way, which holes can be filled with electoconductive material. The removal, however, is advantageous in that it is not necessary to keep the desired functional properties of the layer in mind when the choice of the sacrifice layer is made. Besides, it is then easier to apply additional layers to the cover of the cavity. Removal is done, for example, by means of etching, polishing and/or delaminating. The thickness of the pattened layer is for instance 1 to 30 μm, preferably 5 to 15 μm, and the thickness of the sacrifice layer is for instance 25 to 75 μm.

It is advantageous when the sub-layer is in essence patterned according to the same mask as the patterned layer. The difference is, however, that in a plane parallel to the first side the patterns in the sub-layer have a smaller diameter than corresponding patterns in the patterned layer. More particularly it is advantageous if the patterned layer acts as an etching mask for the sub-layer and wet-chemically etching takes place under the formation of underetching.

The sub-layer may be part of the sacrifice layer. Alternatively, the sub-layer may contain other materials. When the sub-layer is part of the sacrifice layer, the small diameter of the sub-layer is obtained by means of an etching treatment in an etching agent that is selective relative to the material of the patterned layer.

It is furthermore advantageous for the patterned layer to contain a metal. It is advantageous for the cover to be made of metal because this ensures a good sealing of the cavity. In addition, a metal layer shields the electrical element from electromagnetic fields which could hamper the operation of the element. An additional advantage of metal is that this can be etched selectively relative to a large number of materials and is furthermore resistant to many etching agents for the material of the sacrifice layer. Suitable metals are, for example, copper and silver.

In an advantageous variant having a patterned layer of metal, conductive tracks are present on the metallization side of the substrate. Prior to the mounting of the carrier, electroconductive connectors are mounted on these tracks. These connectors are brought into contact with tracks in the patterned layer when the carrier is mounted. Due to the presence of these tracks the device can be very well integrated with further elements or devices. The tracks may be part of an interconnect pattern. Alternatively, the tracks may be connected to a coil or a capacitor electrode. The interconnect pattern is then preferably continued above the cover.

In a further elaboration hereof the tracks in the patterned layer are contact pads to which solder may be applied. In this fashion the device may be mounted on a carrier as a Surface Mount Device. This carrier may for that matter also be a semiconductor device containing a high-frequency circuit or an amplifier.

In a further, highly advantageous embodiment a deformed foil is used as a foil. After deformation this foil has a protrusion which is bounded by an edge. This foil is applied to the substrate in such a way that the protrusion in the foil forms the cover of the cavity and the edge is in contact with the substrate. In other words, the foil, seen from the second side, has the protrusion that corresponds to a recessed part on the opposite, first side of the foil. The advantage of this embodiment is that there is no need for large spacers or recesses in the substrate to create as yet a cavity that is sufficiently high. For the deformation of the foil may be used, for example, a foil having a patterned layer of copper and a sacrifice layer of aluminum.

For an efficient manufacture it is furthermore advantageous when at the same time a large number of electronic devices are manufactured. In that case the substrate contains a plurality of electrical elements belonging to different electronic devices. When the foil is applied, a plurality of covers is formed and after the sacrifice layer has been removed the whole of substrate and foil is separated into individual electronic devices.

It is a second object of the invention to provide an electronic device of the type defined in the opening paragraph, having a cavity that is adequately isolated and that can be manufactured without layers being deposited on the electrical element.

This second object is achieved in that a layer is present as a cover, which layer is attached to the substrate by isolating material that is situated in a space beside the cavity, the layer being mechanically embedded in the isolating material. The electronic device according to the invention can be manufactured in an advantageous way with the method according to the invention. In an advantageous embodiment thereof the cover contains a metal which provides proper shielding. In a further embodiment the substrate comprises an integrated circuit. In this fashion additional functionality of sensitive elements can be added to an integrated circuit. Alternatively, it may be that in and/or on the substrate a network of passive components is present. MEMS capacitors and switches combined with other passive elements may form, for example, an impedance matching circuit which is also suitable for larger bandwidths. Examples of elements and materials that may be present in the device according to the invention are given above.

These and other aspects of the invention are apparent from and will be elucidated with reference to the embodiments described hereinafter.

In the drawings:

FIG. 1 shows a cross-section of a first embodiment of the device; and

FIGS. 2A–E show consecutive steps in the method of producing the embodiment shown in FIG. 1.

FIG. 1 shows diagrammatically and in cross-sectional view a first embodiment of the device 100 according to the invention. The device comprises a substrate 20 and a cover 38 which together enclose a cavity 37. Around the cavity 37 there is a space filled with isolating material 7. A cover 38 i.e. a patterned metal layer is embedded in this isolating material 7 so that the whole is mechanically robust. In this example there is a micro-electromechanical system (MEMS) capacitor 30 in the cavity 37. The MEMS capacitor 30 is connected to a contact pad 40 via an interconnect layer 24 and associated vias 35. The contact pad 40 is connected by solder bumps 42 to a second contact pad 41. This accommodates a further bump 43 for the purpose of mounting the device on a carrier.

Figure 2A:
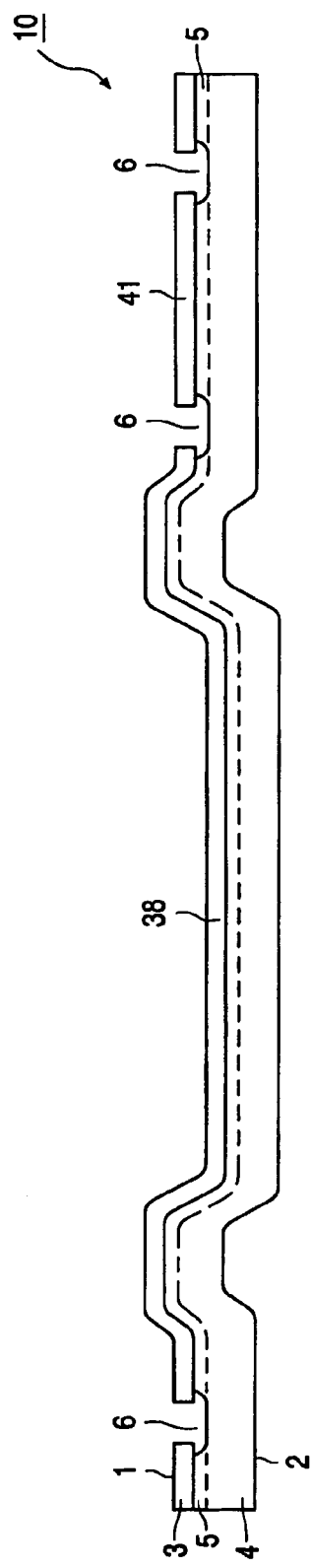
Figure 2B:
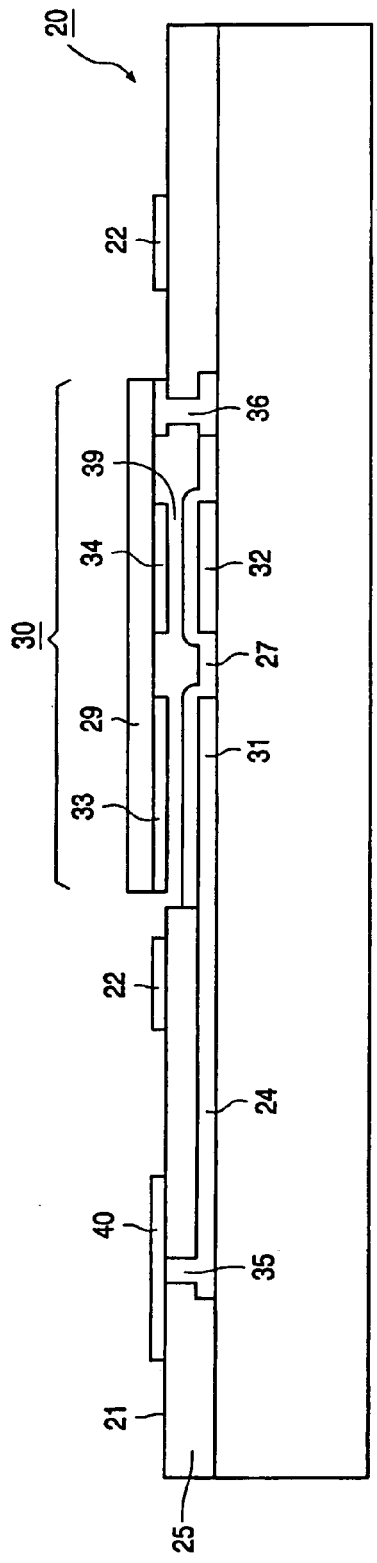
Figure 2C:
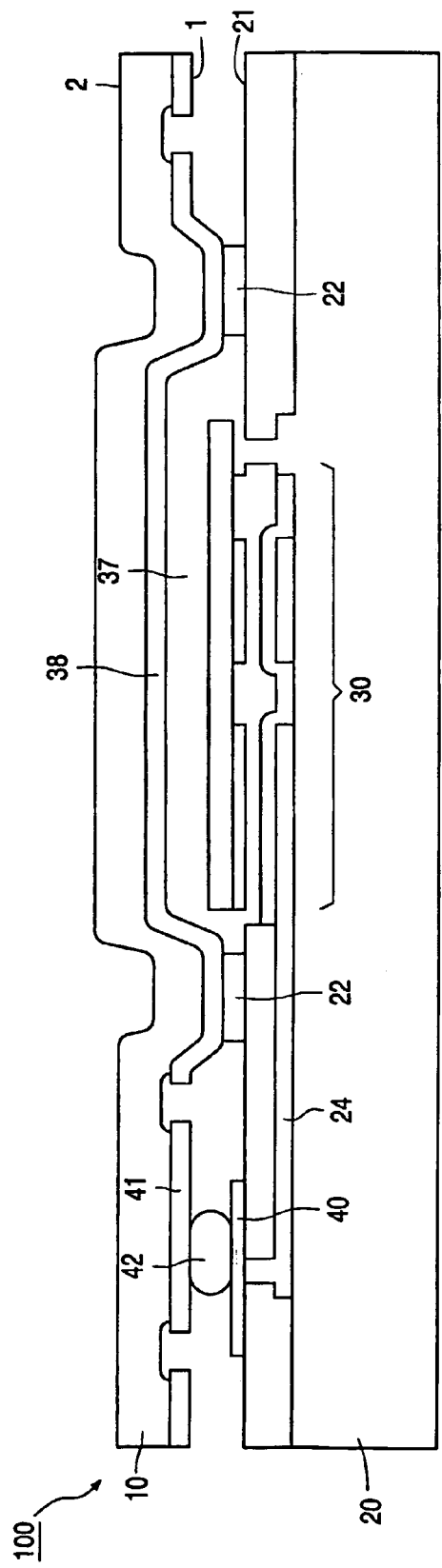

FIG. 2 shows a number of steps in the manufacturing method of the device 100. FIG. 2A shows the carrier 10 prior to assembly. FIG. 2B shows the substrate 20 prior to assembly. FIG. 2C shows the device 106 immediately after assembly. FIG. 2D shows the device 100 after the isolating material 7 has been applied. FIG. 2E shows the device after the sacrifice layer 4 has been removed.

FIG. 2A shows the carrier 10 as applied in the method according to the invention. In this example, but this is not essential, the carrier 10 has a first side 1 and a second side 2, with a patterned layer 3 on the first side 1 and a sacrifice layer 4 on the second side 2. A sub-layer 5 which in this embodiment is part of the sacrifice layer 4 is in contact with the patterned layer 3. The sacrifice layer 4 is in this case an aluminum layer having a thickness of about 60 μm. The patterned layer 3 comprises copper and has a thickness of about 10 μm. The carrier is manufactured as follows: a halter-like mask of silicon dioxide is formed on the patterned layer 3 by means of photolithography, after which outside this mask the copper is removed from the patterned layer 3 by means of etching with a watery solution of ferrichloride. During this operation a recess 6 is formed in the carrier 10. The recess 6 defines a cover 38 and a contact pad 41. Then part of the sacrifice layer 4 is removed with another, selective etching agent. During this operation underetching occurs of the sacrifice layer 4 relative to the patterned layer 3 while the sub-layer 5 is being formed. The recess 6 then has a larger diameter in the plane of the sub-layer 5 than in the plane of the patterned layer 3. For example caustic soda solution may, for example, be used as a selective etching means for aluminum. Then the carrier 10 is deformed. For this purpose a mold is brought into contact with the carrier 10 while the carrier 10 is placed on a solid underground. The mold has a desired pattern so that the cover is produced. The mold is, for example, an Si substrate with Ni bumps on it having the desired pattern. The mold may be located on the second side 2 and on the first side 1 of the carrier 10.

FIG. 2B shows the substrate prior to assembly. The substrate 20 is a polycrystalline silicon substrate which is made high ohmic by radiation with ion or electron beams. The substrate is provided with an oxide and first electrode layer of Al on the metallization side 21, which layers are not shown. Herein is defined a first capacitor electrode 31 of a micro-electromechanical system (MEMS) capacitor 30. At the same time a driving electrode 32 of the MEMS capacitor 30 is defined herein and an interconnect 24 is defined. There is an isolation layer 25 with vias 35 on top of the first electrode layer. The isolation layer 25 is patterned and replaced by a dielectric layer 27 at the location of the MEMS capacitor. Furthermore, this dielectric layer may also form part of the isolation layer 25. The isolation layer 25 accommodates a second electrode layer. In the second electrode layer the second capacitor electrode 33 and the driving electrode 34 and the bridge 36 of the MEMS capacitor 30 are defined. Furthermore, a contact pad 40 and an annular track 22 are defined in the second electrode layer. The contact pad 40 is electrically connected to the MEMS capacitor 30 by means of via 35.

Whereas conductive glue is applied in this example of embodiment for connecting the annular track 22 to the carrier 10, it is alternatively possible to apply metal bumps or solder. The additional advantage of this is that an hermetic sealing of the MEMS capacitor 30 is obtained. More particularly when bumps are used, for example, of Au or an Au alloy, it is advantageous when the annular track 22 and the patterned layer 3 of the carrier have an adhesive layer, for example made of Ag, also known to the expert. It is furthermore advantageous to apply bumps or solder to both the contact pad 40 and the annular track 22. However, it is also possible for the solder or metal bumps to be mounted on the carrier 10 in lieu of on the substrate 20. More particularly when use is made of metal bumps having an Au alloy such as Au—Sn, it is advantageous also to apply a liquid layer or layer that can be liquefied, for example, an acrylate as described in non-prepublished application EP 02077228.1 (PHNL020471). The acrylic layer is located on carrier 10 in that case. As a result of a temperature treatment, at high temperature the metal bumps will move through the acrylic layer when the substrate 20 is applied to the carrier 10 or vice versa, without the bump dissolving.

The second electrode layer 28 is reinforced with a further metal layer 29. If this further metal layer 29 comprises copper, it is deposited by electroplating; if this layer comprises aluminum, this metal layer is evaporated. There is an air gap between the second electrode layer 28 and the dielectric layer 27. This air gap 39 is formed by applying, for example, an oxide to the dielectric layer 27 in a desired pattern and selectively removing this oxide from the dielectric layer 27 after the further metal layer 29 has been deposited. The second electrode layer 26 also contains tracks 22.

FIG. 2C shows the device 100 after assembly of the carrier 10 and the substrate 20. Prior to the assembly solder bumps 42 are applied to the metallization side 21 of the substrate 20. In lieu of solder bumps 42, for example, also Au bumps may be used. Alignment of the carrier and the substrate is effected by mechanical aligning means which are provided in the patterned layer 3 of the carrier 10 and the metallization of the substrate 20. Alternatively, the alignment may be effected with light. To obtain a sufficiently sealing link between the patterned layer 3 of the carrier 10 and the conductive layer 24 of the substrate, a heat treatment is carried out at about 200° C. In this way cavity 37 and cover 38 are formed.

FIG. 2D shows a device 100 after isolating material 7 has been applied. Idle between the carrier 10 and the substrate 20. The isolating material 7 is applied in a space around the cavity 37. In this example an epoxy is used as isolating material. Capillary forces, which may be complemented with a vacuum treatment, provide that the epoxy fills the space and also the recesses 6. After the filling an additional heating step is applied to cure the isolating material.

FIG. 2E finally shows the device 100 after removal of the sacrifice layer 4. In this example this is effected by etching with caustic soda solution (NaOH). The device 100 is now finished in essence. Bumps 43 may now be mounted. When the device 100 is manufactured on plate level, the substrate is first separated into individual devices. To simplify this separation, the patterned layer 3 is patterned such that it is absent at the location of the saw lanes. Alternatively, additional layers may be applied on top of the patterned layer.

In summary, an electronic device is provided in which a cover is in contact with the substrate and thus defines a cavity. The adhesion between substrate and cover is produced in that the cover is mechanically embedded in isolating material around the cavity. An advantage of the invention is that together with the cavity also interconnectors are made. Thus it is possible to integrate the cavity with an arbitrary component inside it with an electronic device. The cover may be advantageously provided with a sacrifice layer which is removed after assembly. An electrical element may be defined in the cavity or mounted, which element should be hermetically sealed while at the same time it should be connected.

The invention claimed is:

1. A method of manufacturing an electronic device comprising a substrate with a metallization side, on which metallization an electrical element is present in a cavity that is bounded by the substrate and a cover, the method comprising the steps of: providing a foil; applying the foil to the metallization side of the substrate while forming the cavity, part of the foil forming the cover; and affixing the cover to the substrate, characterized in that a foil is provided which comprises a patterned layer on a first side and a sacrifice layer on a second side, the foil is placed to a protruding part of the substrate, an interstice between the substrate and the foil developing around the cavity; and the foil is affixed to the substrate by filling an interstice around the substrate with isolating material.

2. A method as claimed in claim 1, characterized in that a patterned sub-layer is present in a carrier between the patterned layer and the sacrifice layer, which patterned layer and sub-layer have a first and a second pattern which are mutually distinguished by a recess that has a larger diameter in the plane of the sub-layer than in the plane of the patterned layer, whereby the patterned layer is embedded in the isolating material when the isolating material is applied.

3. A method as claimed in claim 1, characterized in that the sacrifice layer is removed after the foil has been affixed to the substrate.

4. A method as claimed in claim 1, characterized in that the patterned layer contains a metal.

5. A method as claimed in claim 4, characterized in that guiding tracks are present on the metallization side of the substrate beside the cavity, on which tracks electroconductive connectors are mounted prior to the mounting of the carrier, which connectors are brought into contact with tracks in the patterned layer when the carrier is mounted.

6. A method as claimed in claim 5, characterized in that the tracks in the patterned layer which are brought into contact with electrical connectors, are contact pads on which solder can be deposited.

7. A method as claimed in claim 1, characterized in that: a deformed foil is used as a foil, which deformed foil has a protrusion that is bounded by an edge; and the foil is affixed to the substrate so that the protrusion in the foil forms the cover of the cavity and the edge is in contact with the substrate.

8. An electronic device comprising a substrate with a metallization side on which metallization side an electrical element is present in a cavity that is bounded by the substrate and a cover, characterized in that as a cover a layer is present which is stuck to the substrate by isolating material that is situated in a space beside the cavity, the layer being mechanically embedded in the isolating material.

9. An electronic device as claimed in claim 8, characterized in that the mechanically embedded layer contains a metal.

10. An electronic device as claimed in claim 8, characterized in that the substrate comprises an integrated circuit.

11. An electronic device as claimed in claim 8, characterized in that the electrical element is a micro-mechanical system (MEMS) element.

12. A method for manufacturing an electronic device, the method comprising:
providing a semiconductor substrate arrangement having an electronic circuit on a substrate;
forming a carrier arrangement having a conductive cover layer on a sacrificial layer and patterning the cover layer to separate portions thereof;
arranging the carrier arrangement with the cover layer facing the semiconductor substrate, a suspended portion of the carrier arrangement suspended above the semiconductor substrate leaving a gap therebetween, and a support portion of the cover layer supporting the carrier arrangement over the substrate arrangement;
filling the gap between the substrate arrangement and the carrier arrangement with an insulator material to couple the cover layer to the substrate and to seal a cavity between the electronic circuit and a portion of the cover layer suspended over the electronic circuit; and
removing the sacrificial layer to expose the cover layer.

13. The method of claim 12, wherein filling the gap includes filling a patterned opening between different portions of the cover layer.

14. The method of claim 12, wherein forming a carrier arrangement having a conductive cover layer includes forming a metallic conductive cover layer.

15. The method of claim 12, further including forming a protrusion on the substrate, wherein arranging the carrier arrangement includes supporting the carrier arrangement on the protrusion.

16. The method of claim 12, wherein forming a carrier arrangement includes forming a sacrificial layer having a depression therein and forming the conductive cover layer on the sacrificial layer, the conductive layer having a corresponding depression, and wherein arranging the carrier arrangement with the cover layer facing the semiconductor substrate includes inverting the cover layer and arranging the recessed portion of the cover layer over the electric circuit to form the cavity between the cover layer and the electronic circuit.

17. The method of claim 12, further including forming a conductive contact protruding from the substrate and contacting a portion of the electronic circuit, wherein arranging the carrier arrangement includes arranging a portion of the cover layer to contact the conductive contact.

18. The method of claim 17, wherein arranging a portion of the cover layer to contact the conductive contact includes arranging a contact portion of the cover layer on the conductive contact, the contact portion of the cover layer being separated via patterning from another portion of the cover layer suspended over the cavity.

19. The method of claim 18, wherein filling the gap includes filling a patterned opening between the contact portion of the cover layer and the other portion of the cover layer suspended over the cavity.

20. The device of claim 8, wherein the cover is patterned to separate a first portion from a second portion thereof, the first portion bounding the cavity and the second portion electrically coupled to the electrical element, the isolating material coupling both the first and second portions of the cover to the substrate.

21. The device of claim 20, wherein the isolating material electrically isolates the first portion of the cover from the second portion of the cover.

* * * * *